(12) United States Patent
Kawashima et al.

(10) Patent No.: US 10,964,630 B2
(45) Date of Patent: Mar. 30, 2021

(54) SEMICONDUCTOR DEVICE HAVING A CONDUCTOR PLATE AND SEMICONDUCTOR ELEMENTS

(71) Applicant: DENSO CORPORATION, Kariya (JP)

(72) Inventors: Takanori Kawashima, Anjo (JP); Makoto Imai, Toyota (JP); Masaki Aoshima, Toyota (JP)

(73) Assignee: DENSO CORPORATION, Kariya (JP)

( * ) Notice: Subject to any disclaimer, the term of this patent is extended or adjusted under 35 U.S.C. 154(b) by 16 days.

(21) Appl. No.: 16/527,448

(22) Filed: Jul. 31, 2019

(65) Prior Publication Data

US 2020/0098673 A1 Mar. 26, 2020

(30) Foreign Application Priority Data

Sep. 21, 2018 (JP) .............................. JP2018-177460

(51) Int. Cl.
| | |
|---|---|
| *H01L 23/495* | (2006.01) |
| *H01L 23/492* | (2006.01) |
| *H01L 23/00* | (2006.01) |
| H01L 29/16 | (2006.01) |
| H01L 29/739 | (2006.01) |
| H01L 29/861 | (2006.01) |
| H01L 29/78 | (2006.01) |

(52) U.S. Cl.
CPC ...... *H01L 23/49575* (2013.01); *H01L 23/492* (2013.01); *H01L 23/49531* (2013.01); *H01L 23/49562* (2013.01); *H01L 24/48* (2013.01); *H01L 29/1608* (2013.01); *H01L 29/7393* (2013.01); *H01L 29/78* (2013.01); *H01L 29/861* (2013.01); *H01L 2224/48153* (2013.01)

(58) Field of Classification Search
CPC ............ H01L 23/49575; H01L 23/492; H01L 23/49531; H01L 23/49562; H01L 24/48
See application file for complete search history.

(56) References Cited

U.S. PATENT DOCUMENTS

| | | | |
|---|---|---|---|
| 8,878,347 B2 * | 11/2014 | Kadoguchi | ....... H01L 23/49562 257/666 |
| 10,396,008 B2 * | 8/2019 | Takahagi | .......... H01L 23/49524 |

(Continued)

FOREIGN PATENT DOCUMENTS

WO 2013/179547 A1 12/2013

*Primary Examiner* — Lex H Malsawma
(74) *Attorney, Agent, or Firm* — Oliff PLC

(57) ABSTRACT

A semiconductor device may include a first conductor plate on which a first semiconductor element, a second semiconductor element and a first circuit board are disposed, and a plurality of first signal terminals. A size of the second semiconductor is smaller than a size of the first semiconductor element. In a plan view along a direction perpendicular to the first conductor plate, the plurality of first signal terminals is located in a first direction with respect to the first semiconductor element. The second semiconductor element and the first circuit board are located between the plurality of first signal terminals and the first semiconductor element and are arranged along a second direction that is perpendicular to the first direction. A signal pad of the first semiconductor element is connected to a corresponding one of the plurality of first signal terminals via a signal transmission path of the first circuit board.

15 Claims, 8 Drawing Sheets

(56) References Cited

U.S. PATENT DOCUMENTS

| | | | |
|---|---|---|---|
| 10,763,240 B2* | 9/2020 | Iwasaki | H01L 23/49562 |
| 2012/0001308 A1* | 1/2012 | Fukutani | H01L 24/73 257/675 |
| 2014/0035112 A1* | 2/2014 | Kadoguchi | H01L 24/73 257/666 |
| 2014/0159216 A1* | 6/2014 | Ishino | H01L 23/3114 257/675 |
| 2014/0264819 A1* | 9/2014 | Okumura | H01L 23/49562 257/712 |
| 2015/0155797 A1 | 6/2015 | Okayama | |
| 2015/0162274 A1* | 6/2015 | Kadoguchi | H01L 23/49562 257/694 |
| 2016/0315037 A1* | 10/2016 | Kadoguchi | H01L 23/49568 |
| 2016/0336251 A1* | 11/2016 | Fukuoka | H01L 29/7395 |
| 2017/0018484 A1* | 1/2017 | Kadoguchi | H01L 24/00 |
| 2017/0092559 A1* | 3/2017 | Iwasaki | H01L 23/4334 |
| 2017/0278774 A1* | 9/2017 | Hayashi | H01L 23/4334 |

* cited by examiner

SEMICONDUCTOR DEVICE HAVING A CONDUCTOR PLATE AND SEMICONDUCTOR ELEMENTS

CROSS-REFERENCE TO RELATED APPLICATION

This application claims priority to Japanese patent application No. 2018-177460, filed on Sep. 21, 2018, the entire contents of which are incorporated herein by reference.

TECHNICAL FIELD

The technology disclosed herein relates to a semiconductor device.

BACKGROUND

International Publication WO 2013/179547 discloses a semiconductor device. This semiconductor device includes a conductor plate, a plurality of semiconductor elements disposed on the conductor plate, and a plurality of signal terminals. The plurality of semiconductor elements each include a main electrode electrically connected to the conductor plate and a signal pad electrically connected to a corresponding one of the plurality of signal terminals.

SUMMARY

In a conventional semiconductor device, a plurality of semiconductor elements is arranged along a direction in which a plurality of signal terminals is arranged. Such a configuration enables the semiconductor elements to be disposed near the plurality of signal terminals, but tends to increase a size of a semiconductor device along the direction in which the semiconductor devices (or the signal terminals) are arranged. In view of this problem, the present specification provides a technology of decreasing the size of a semiconductor device.

A semiconductor device disclosed herein may comprise a first conductor plate, a first semiconductor element disposed on the first conductor plate, a second semiconductor element disposed on the first conductor plate, a size of the second semiconductor element being smaller than a size of the first semiconductor element, a first circuit board disposed on the first conductor plate and including a signal transmission path which is electrically isolated from the first conductor plate, and a plurality of first signal terminals. The first semiconductor element and the second semiconductor element each include a main electrode electrically connected to the first conductor plate and a signal pad electrically connected to a corresponding one of the plurality of first signal terminals. In a plan view along a direction perpendicular to the first conductor plate, the plurality of first signal terminals is located in a first direction with respect to the first semiconductor element. In the plan view, the second semiconductor element and the first circuit board are located between the plurality of first signal terminals and the first semiconductor element and are arranged along a second direction that is perpendicular to the first direction. The signal pad of the first semiconductor element is connected to the corresponding one of the plurality of first signal terminals via the signal transmission path of the first circuit board.

In the above-described semiconductor device, two semiconductor elements are arranged not along a direction in which the first signal terminals are arranged (i.e., the second direction) but along a direction perpendicular to this arrangement direction of the first signal terminals (i.e., the first direction). This can decrease the size of the semiconductor device with respect to the direction in which the first signal terminals are arranged. On the other hand, such an arrangement causes the first semiconductor element to be disposed apart from the first signal terminals. Therefore, it is difficult to directly connect the signal pad of the first semiconductor element to the first signal terminals. To solve this difficulty, the first circuit board is prepared between the first semiconductor element and the first signal terminals, and the signal pad of the first semiconductor element is connected to the first signal terminals via the first circuit board. Here, the second semiconductor element is smaller than the first semiconductor element, and the first circuit board, which has a simple structure, can also be configured to be relatively small. Accordingly, the second semiconductor element and the first circuit board can be disposed compactly between the first semiconductor element and the plurality of first signal terminals.

DETAILED DESCRIPTION

Figure 1:
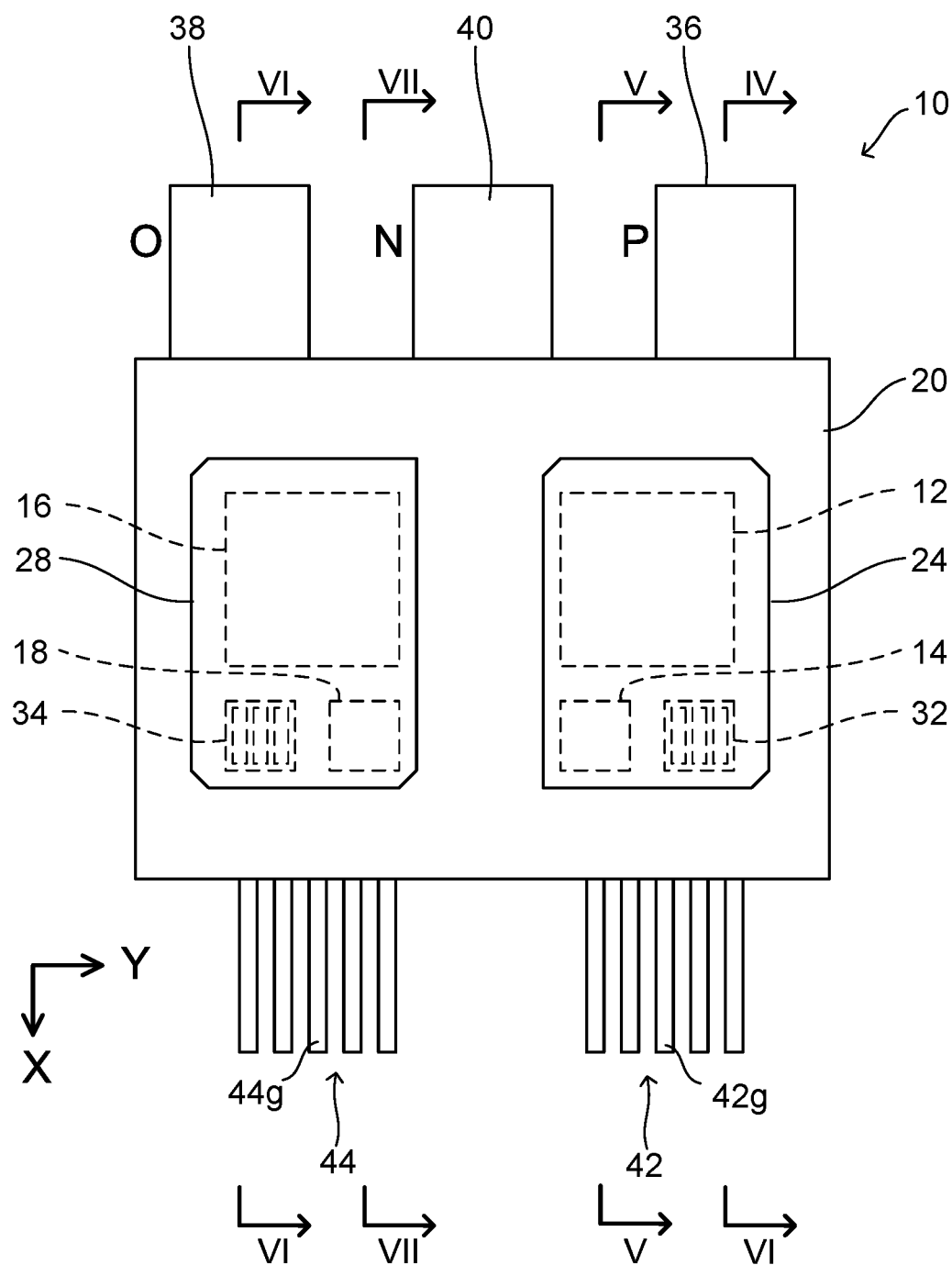
FIG. 1 shows a plan view of a semiconductor device 10 according to an embodiment.
Figure 2:
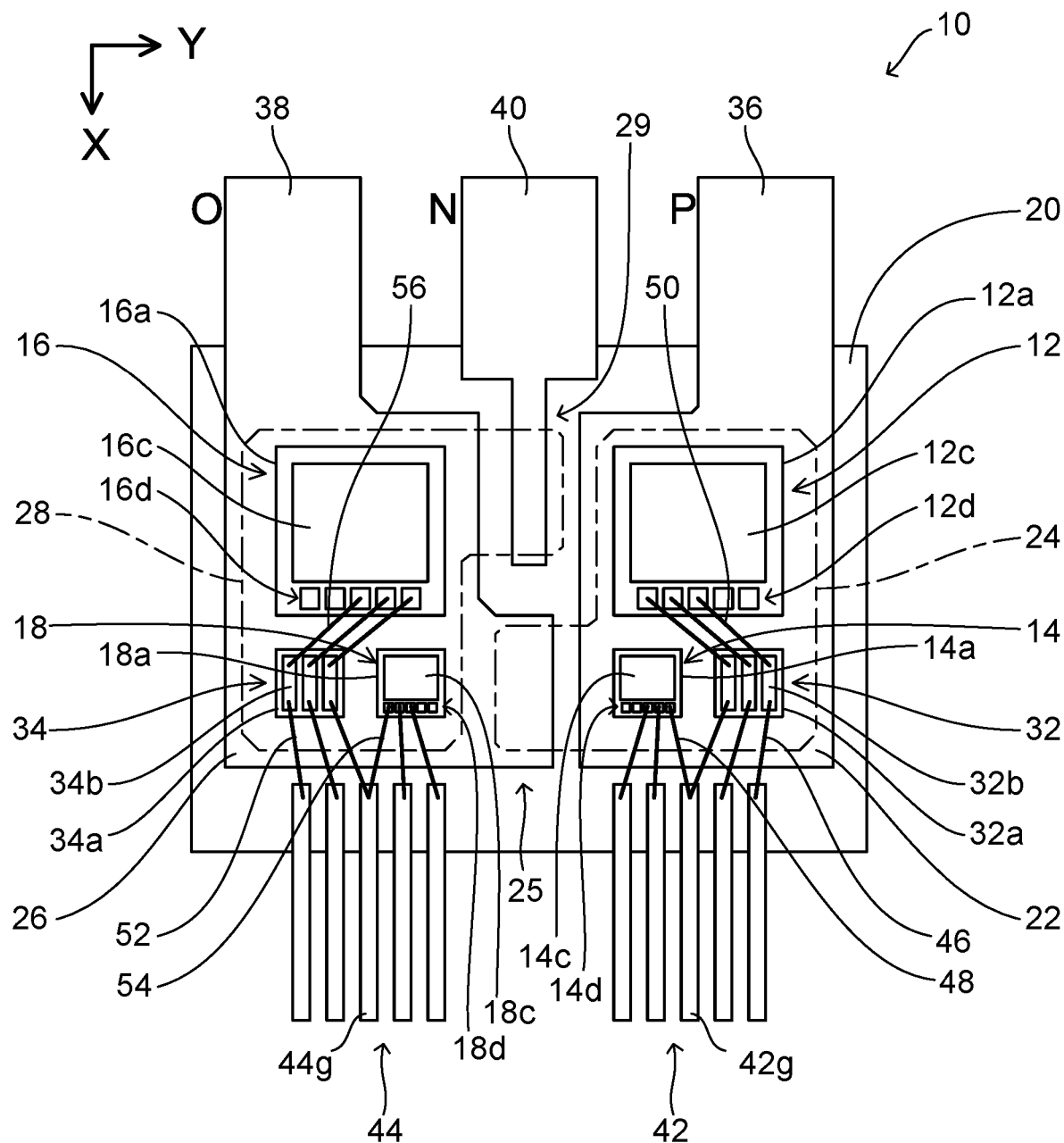
FIG. 2 shows an internal structure of the semiconductor device 10 according to the embodiment in a plan view along a direction perpendicular to conductor plates 22, 24, 26, and 28.
Figure 3:
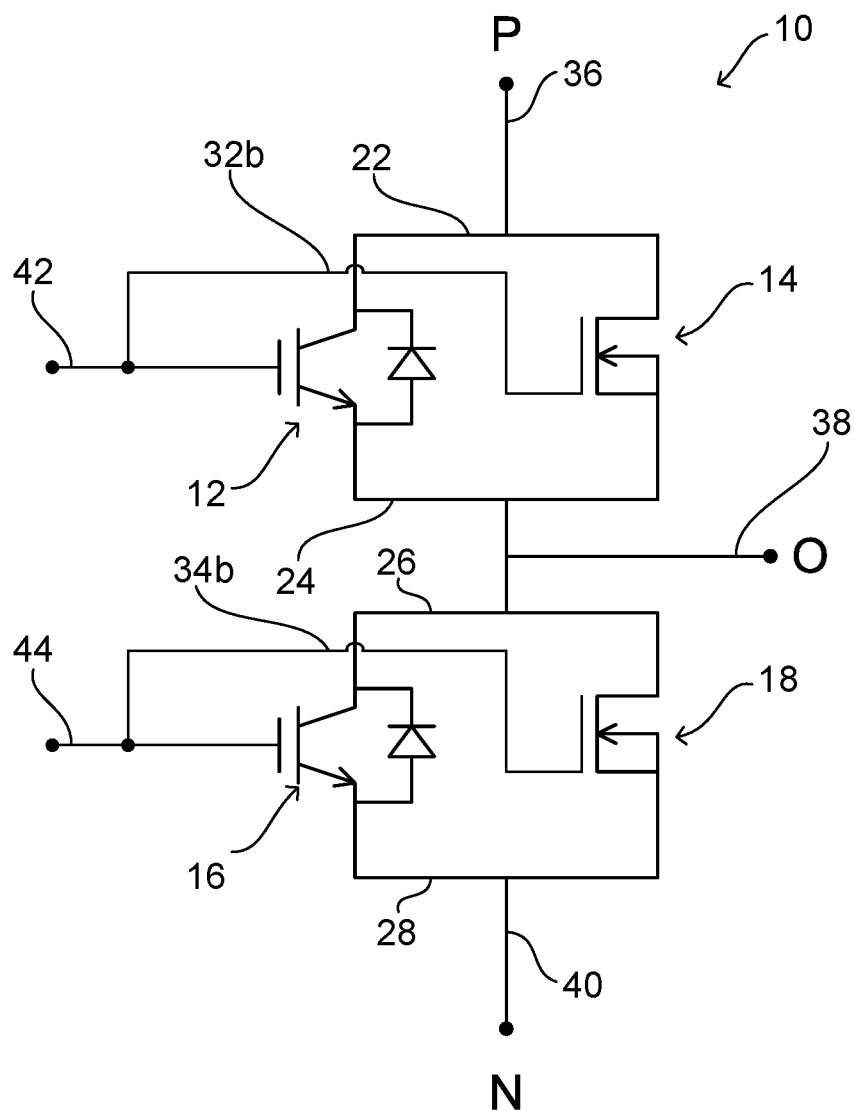
FIG. 3 shows a circuit structure of the semiconductor device 10 according to the embodiment.
Figure 4:
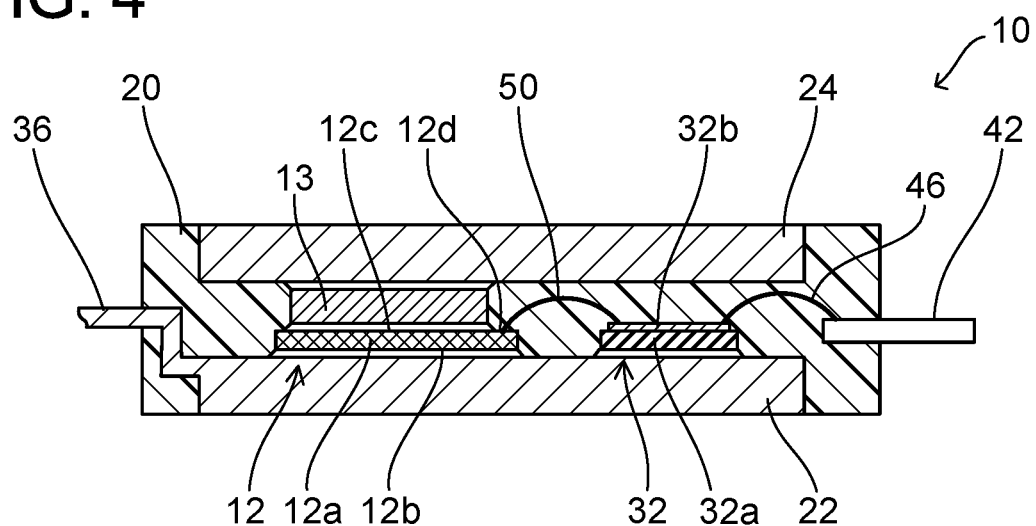
FIG. 4 is a cross-sectional view along a line IV-IV in FIG. 1.
Figure 5:
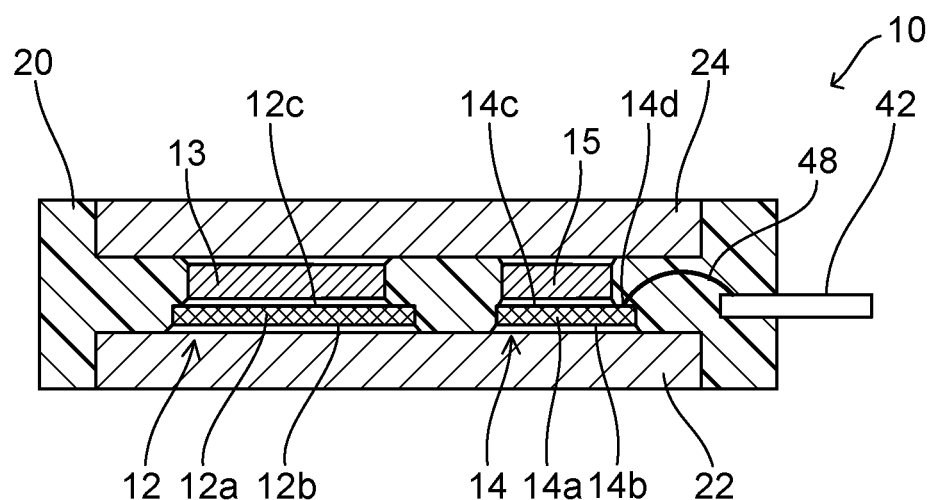
FIG. 5 is a cross-sectional view along a line V-V in FIG. 1.
Figure 6:
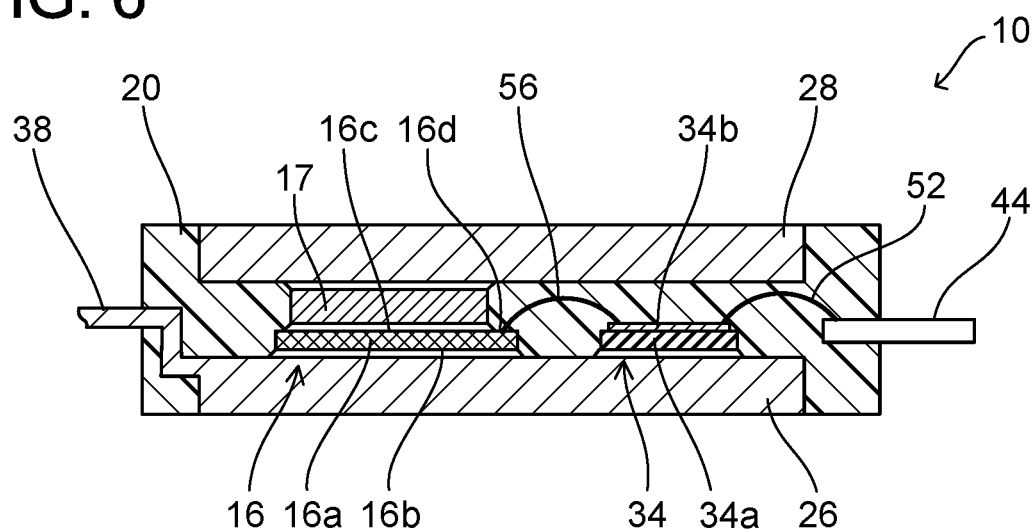
FIG. 6 is a cross-sectional view along a line VI-VI in FIG. 1.
Figure 7:
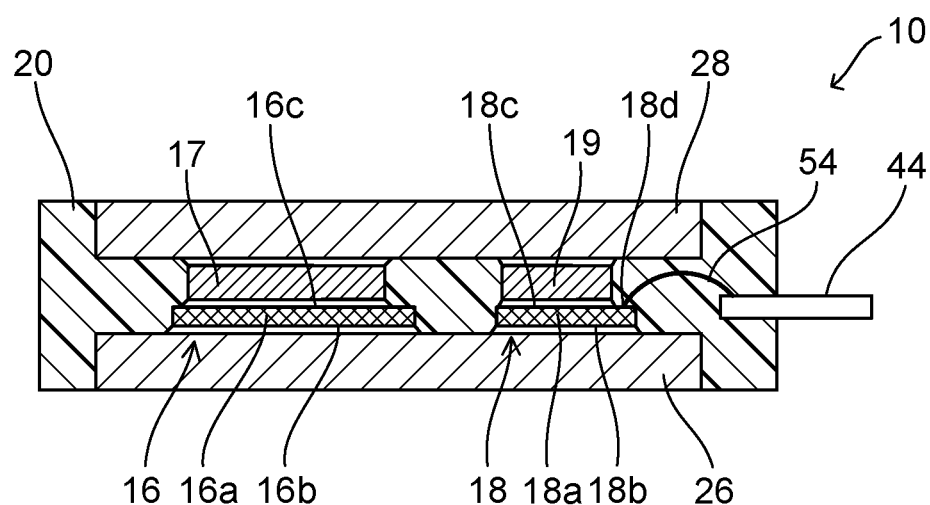
FIG. 7 is a cross-sectional view along a line VII-VII in FIG. 1.

In an embodiment of the present technology, a semiconductor device may further include a second conductor plate opposed to the first conductor plate. The first semiconductor element and the second semiconductor element may each include another main electrode which is electrically connected to the second conductor plate. As such, the structure in which two semiconductor elements are disposed between a pair of conductor plates enables the pair of conductor plates to effectively dissipate heat of each of the semiconductor elements.

In an embodiment of the present technology, the semiconductor device may further include a third conductor plate located in the second direction with respect to the first conductor plate, a third semiconductor element disposed on the third conductor plate, a fourth semiconductor element disposed on the third conductor plate, a size of the fourth semiconductor element being smaller than a size of the third semiconductor element, a second circuit board disposed on the third conductor plate and including a signal transmission path which is electrically isolated from the third conductor plate, and a plurality of second signal terminals. Here, the third conductor plate may be a member physically independent of the first conductor plate, or may be formed integrally with the first conductor plate. In other words, in the latter form, the first conductor plate and the third conductor plate may be constituted of a single, common conductor plate.

In the above-described embodiment, the third semiconductor element and the fourth semiconductor element may each include a main electrode electrically connected to the third conductor plate and a signal pad electrically connected to a corresponding one of the plurality of second signal terminals. In a plan view along a direction perpendicular to the third conductor plate, the plurality of second signal terminals may be located in the first direction with respect to the third semiconductor element and be arranged along the second direction. In the plan view, the fourth semiconductor element and the second circuit board may be located between the plurality of second signal terminals and the third semiconductor element and be arranged along the second direction. The signal pad of the third semiconductor element may be connected to the corresponding one of the plurality of second signal terminals via the signal transmission path of the second circuit board. As such, the structure disclosed herein can be provided in repetitious fashion along the second direction, so that a semiconductor device that includes much more semiconductor elements can be realized.

In the above-described embodiment, the semiconductor device may further include a fourth conductor plate opposed to the third conductor plate. The third semiconductor element and the fourth semiconductor element may each include another main electrode which is electrically connected to the fourth conductor plate. As such, the structure in which two semiconductor elements are disposed between a pair of conductor plates enables the pair of the conductor plates to effectively dissipate heat of each of the semiconductor elements.

In the above-described embodiment, the third conductor plate may be connected to the second conductor plate via a first connector portion. In this case, in the plan view along the direction perpendicular to the third conductor plate, the first connector portion may be located between the second semiconductor element and the fourth semiconductor element. Such a configuration allows a parallel circuit made of the first and second semiconductor elements and a parallel circuit made of the third and fourth semiconductor elements to be connected to each other in series. In particular, the first connector portion is close to the second semiconductor element and the fourth semiconductor element, so that a current path between the first connector portion and the second semiconductor element and a current path between the first connector portion and the fourth semiconductor element can be configured to be short.

In the above-described embodiment, a layout of the first semiconductor element, the second semiconductor element, and the first circuit board on the first conductor plate may be bisymmetric with a layout of the third semiconductor element, the fourth semiconductor element, and the second circuit board on the third conductor plate. Such a configuration increases structural symmetry of the semiconductor device, so that durability of the semiconductor device, for example, can be improved.

In the above-described embodiment, the first semiconductor element and the third semiconductor element may be first-kind semiconductor elements including the same configuration as each other. In this case, the first-kind semiconductor elements may each include a plurality of signal pads that is arranged along the second direction. The plurality of signal pads may include a pair of the signal pads having the same function, and the pair of the signal pads may be located bisymmetrically in an arrangement of the plurality of signal pads. Such a configuration enables a connecting structure between the first semiconductor element and the first circuit board and a connecting structure between the third semiconductor element and the second circuit board to be bisymmetric, while adopting the same semiconductor elements for the first semiconductor element and the third semiconductor element.

The above-described configuration can also be adopted for the second semiconductor element and the fourth semiconductor element. In other words, the second semiconductor element and the fourth semiconductor element may be second-kind semiconductor elements including the same configuration as each other. In this case, the second-kind semiconductor elements may each include a plurality of signal pads that is arranged along the second direction. The plurality of signal pads may include a pair of the signal pads having the same function, and the pair of the signal pads may be located bisymmetrically in an arrangement of the plurality of signal pads. Such a configuration enables a connecting structure between the second semiconductor element and the first signal terminal and a connecting structure between the fourth semiconductor element and the second signal terminal to be bisymmetric, while adopting the same semiconductor elements for the second semiconductor element and the fourth semiconductor element.

In place of the above-described bisymmetric structure, a layout of the first semiconductor element, the second semiconductor element, and the first circuit board on the first conductor plate may be identical with a layout of the third semiconductor element, the fourth semiconductor element, and the second circuit board on the third conductor plate. Such a structure can facilitate, for example, designing and manufacturing of the semiconductor device, although that depends on other conditions also.

In an embodiment of the present technology, a bandgap of a semiconductor substrate of the second semiconductor element may be wider than a bandgap of a semiconductor substrate of the first semiconductor element. A so-called wide-bandgap semiconductor substrate is superior in performance, but has a drawback of being relatively expensive. In view of this, adopting a wide-bandgap semiconductor substrate for the second semiconductor element, which has a smaller size, can improve performance of the semiconductor device, while reducing a cost of manufacturing the semiconductor device.

In the above-described embodiment, the semiconductor substrate of the first semiconductor element may be a silicon (Si) substrate, and the semiconductor substrate of the second semiconductor element may be a silicon carbide (SiC) substrate. It should be noted that this combination is an example, and combinations of various semiconductor substrates can be adopted for the first semiconductor element and the second semiconductor element.

In an embodiment of the present technology, the semiconductor device may further include a first bonding wire connecting between one of the plurality of first signal terminals and the signal transmission path of the first circuit board, and a second bonding wire connecting between another one of the plurality of first signal terminals and the signal pad of the second semiconductor element. In this case, as the first bonding wire approaches the first circuit board, the first bonding wire may extend to be away from the second bonding wire. Such a structure can suppress interference caused by a noise, for example, between the first bonding wire and the second bonding wire, while allowing the plurality of first signal terminals to be disposed at small intervals.

In an embodiment of the present technology, a dimension of the second semiconductor element in the first direction may be equal to a dimension of the first circuit board in the first direction. Such a configuration increases structural symmetry between the second semiconductor element and the first circuit board, so that durability of the semiconductor device, for example, can be improved.

Additionally or alternatively for the above, a dimension of the second semiconductor element in the second direction may be equal to a dimension of the first circuit board in the second direction. Such a configuration also increases structural symmetry between the second semiconductor element and the first circuit board, so that durability of the semiconductor device, for example, can be improved.

In an embodiment of the present technology, an interval between the first semiconductor element and the second semiconductor element in the first direction may be equal to an interval between the first semiconductor element and the first circuit board in the first direction. Such a configuration also increases structural symmetry between the second semiconductor element and the first circuit board, so that durability of the semiconductor device, for example, can be improved.

In an embodiment of the present technology, the second semiconductor element and the first circuit board may be located within a region defined by virtually expanding the first semiconductor element in the first direction. Such a structure can sufficiently decrease the size of the semiconductor device with respect to the direction in which the first signal terminals are arranged (i.e., the second direction). It should be noted that, as another embodiment, a part of the second semiconductor element and/or a part of the first circuit board may be located outside the region.

Representative, non-limiting examples of the present disclosure will now be described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENTS

With reference to the drawings, a semiconductor device 10 in an embodiment will be described. The semiconductor device 10 in the present embodiment is a power semiconductor device, and can be implemented for a power conversion circuit such as a converter or an inverter in an electrically-powered vehicle, such as, for example, an electric vehicle, a hybrid vehicle, and a fuel-cell vehicle. It should be noted that an application purpose of the semiconductor device 10 is not limited to a particular one. The semiconductor device 10 can be widely adopted for various devices and circuits.

As shown in FIGS. 1 to 7, the semiconductor device 10 comprises a first semiconductor element 12, a second semiconductor element 14, a third semiconductor element 16, a fourth semiconductor element 18, and an encapsulant 20 encapsulating these semiconductor elements 12, 14, 16, and 18. The four semiconductor elements 12, 14, 16, and 18 are power semiconductor elements. The encapsulant 20 is constituted of an insulating material. The encapsulant 20 in the present embodiment is obtained by molding an encapsulating material such as, for example, an epoxy resin with use of a mold, but is not particularly limited thereto.

The first semiconductor element 12 comprises a semiconductor substrate 12a, a lower electrode 12b, an upper electrode 12c, and a plurality of signal pads 12d. The semiconductor substrate 12a is a silicon (Si) substrate, but is not particularly limited thereto. The lower electrode 12b and the upper electrode 12c are main electrodes for power in the first semiconductor element 12. The lower electrode 12b is located on a lower surface of the first semiconductor element 12, and the upper electrode 12c and the plurality of signal pads 12d are located on an upper surface of the first semiconductor element 12. The first semiconductor element 12 is a Reverse Conducting (RC)-Insulated Gate Bipolar Transistor (IGBT), but is not particularly limited thereto, and is configured such that an IGBT and a diode are integrally formed in the single semiconductor substrate 12a. A collector of the IGBT and a cathode of the diode are connected to the lower electrode 12b, and an emitter of the IGBT and an anode of the diode are connected to the upper electrode 12c. Notably, a pad herein means a small electrode constituted of a conductor (or a semiconductor).

The second semiconductor element 14 comprises a semiconductor substrate 14a, a lower electrode 14b, an upper electrode 14c, and a plurality of signal pads 14d. The semiconductor substrate 14a of the second semiconductor element 14 is a silicon carbide (SiC) substrate, but is not particularly limited thereto. The semiconductor substrate 14a of the second semiconductor element 14 is smaller than the semiconductor substrate 12a of the first semiconductor element 12. In other words, a size of the second semiconductor element 14 is smaller than a size of the first semiconductor element 12. The lower electrode 14b and the upper electrode 14c are main electrodes for power in the second semiconductor element 14. In the second semiconductor element 14 as well, the lower electrode 14b is located on a lower surface of the second semiconductor element 14, and the upper electrode 14c and the plurality of signal pads 14d are located on an upper surface of the second semiconductor element 14. The second semiconductor element 14 is a Metal-Oxide-Semiconductor Field-Effect Transistor (MOSFET), but is not particularly limited thereto. A drain of the MOSFET is connected to the lower electrode 14b, and a source of the MOSFET is connected to the upper electrode 14c.

The third semiconductor element 16 is a semiconductor element having the same structure as the structure of the first semiconductor element 12. In other words, semiconductor elements of the same kind (i.e., the same design) are adopted for the first semiconductor element 12 and the third semiconductor element 16. In other words, the third semiconductor element 16 also includes a semiconductor substrate 16a, a lower electrode 16b, an upper electrode 16c, and a plurality of signal pads 16d. The third semiconductor element 16 is an RC-IGBT, and its semiconductor substrate 16a is a silicon substrate. In the third semiconductor element 16 as well, a collector of the IGBT and a cathode of the diode are connected to the lower electrode 16b, and an emitter of the IGBT and an anode of the diode are connected to the upper electrode 16c. It should be noted that the third semiconductor element 16 may also be a semiconductor element having a structure and/or a size different from the structure and/or the size of the first semiconductor element 12.

The fourth semiconductor element 18 is a semiconductor element having the same structure as the structure of the second semiconductor element 14. In other words, semiconductor elements of the same kind (i.e., the same design) are adopted for the second semiconductor element 14 and the fourth semiconductor element 18. That is, the fourth semiconductor element 18 also includes a semiconductor substrate 18a, a lower electrode 18b, an upper electrode 18c, and a plurality of signal pads 18d. The fourth semiconductor element 18 is a MOSFET, and its semiconductor substrate 18a is a silicon carbide substrate. In the fourth semiconductor element 18 as well, a drain of the MOSFET is connected to the lower electrode 18b, and a source of the MOSFET is connected to the upper electrode 18c. It should be noted that the fourth semiconductor element 18 may also be a semiconductor element having a structure and/or a size different from the structure and/or the size of the second semiconductor element 14.

The semiconductor device 10 further includes a first conductor plate 22, a second conductor plate 24, a third conductor plate 26, and a fourth conductor plate 28. The conductor plates 22, 24, 26, and 28 are each constituted of a conductor such as copper or another metal. It should be noted that, the conductor plates 22, 24, 26, and 28 may each be a laminated substrate (also termed an insulated substrate) in which a conductor layer is formed on an insulator substrate. The first conductor plate 22 and the second conductor plate 24 are opposed to each other with the first semiconductor element 12 and the second semiconductor element 14 disposed therebetween. On the first conductor plate 22, the second semiconductor element 14 is located in a first direction (an X direction in FIGS. 1 and 2) with respect to the first semiconductor element 12. The lower electrodes 12b and 14b of the first semiconductor element 12 and the second semiconductor element 14 are electrically connected to the first conductor plate 22 by soldering. The upper electrodes 12c and 14c of the first semiconductor element 12 and the second semiconductor element 14 are electrically connected to the second conductor plate 24 via conductor spacers 13 and 15 by soldering, respectively. The first semiconductor element 12 and the second semiconductor element 14 are thereby electrically connected in parallel between the first conductor plate 22 and the second conductor plate 24.

Similarly, the third conductor plate 26 and the fourth conductor plate 28 are opposed to each other with the third semiconductor element 16 and the fourth semiconductor element 18 disposed therebetween. On the third conductor plate 26, the fourth semiconductor element 18 is located in the first direction (the X direction in FIGS. 1 and 2) with respect to the third semiconductor element 16. The lower electrodes 16b and 18b of the third semiconductor element 16 and the fourth semiconductor element 18 are electrically connected to the third conductor plate 26 by soldering. The upper electrodes 16c and 18c of the third semiconductor element 16 and the fourth semiconductor element 18 are electrically connected to the fourth conductor plate 28 via conductor spacers 17 and 19 by soldering, respectively. The third semiconductor element 16 and the fourth semiconductor element 18 are thereby electrically connected in parallel between the third conductor plate 26 and the fourth conductor plate 28.

The first conductor plate 22 is exposed to an outside at a lower surface of the encapsulant 20, and the second conductor plate 24 is exposed to the outside at an upper surface of the encapsulant 20. The first conductor plate 22 and the second conductor plate 24 thereby not only constitute a part of a conductive path in the semiconductor device 10, but also function as heat-dissipating plates that dissipate heat of the first semiconductor element 12 and the second semiconductor element 14 to the outside. Similarly, the third conductor plate 26 is exposed to the outside at the lower surface of the encapsulant 20, and the fourth conductor plate 28 is exposed to the outside at the upper surface of the encapsulant 20. The third conductor plate 26 and the fourth conductor plate 28 thereby also not only constitute a part of the conductive path in the semiconductor device 10, but also function as heat-dissipating plates that dissipate heat of the third semiconductor element 16 and the fourth semiconductor element 18 to the outside.

The first conductor plate 22 and the third conductor plate 26 are arranged side by side along a second direction (a Y direction in FIGS. 1 and 2) perpendicular to the above-described first direction X. The second conductor plate 24 and the fourth conductor plate 28 are similarly arranged side by side along the second direction Y. The third conductor plate 26 is electrically connected to the second conductor plate 24 via a first connector portion 25 located within the encapsulant 20. A parallel circuit made of the first semiconductor element 12 and the second semiconductor element 14 is thereby electrically connected in series to a parallel circuit made of the third semiconductor element 16 and the fourth semiconductor element 18. In a plan view along a direction perpendicular to the third conductor plate 26, the first connector portion 25 is located between the second semiconductor element 14 and the fourth semiconductor element 18, and is close to each of the second semiconductor element 14 and the fourth semiconductor element 18. A current path between the first connector portion 25 and the second semiconductor element 14 and a current path between the first connector portion 25 and the fourth semiconductor element 18 are thereby configured to be short.

Figure 8:
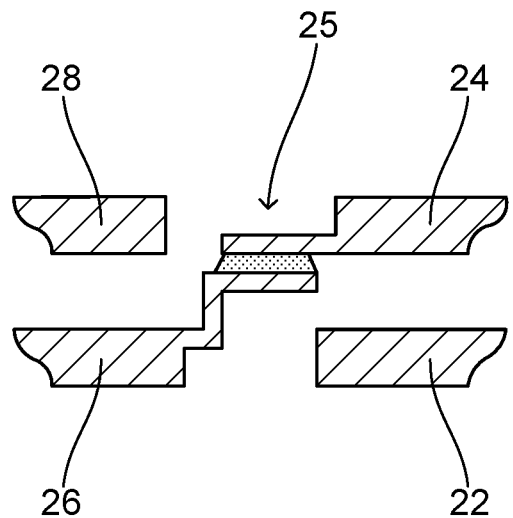
FIG. 8 is a diagram schematically showing a structure of a first connector portion 25.
Figure 9:
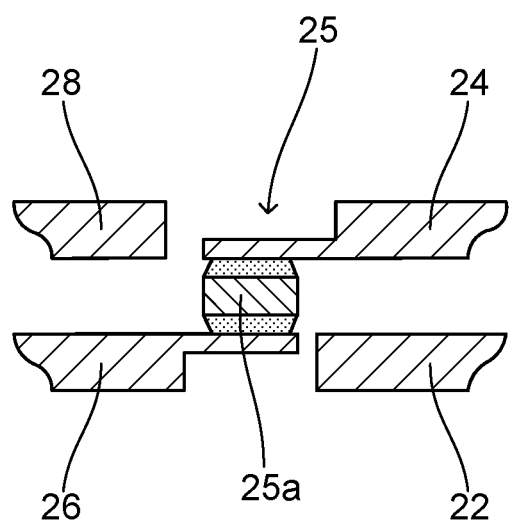
FIG. 9 is a diagram schematically showing a structure of a variation of the first connector portion 25.

As an example, as shown in FIG. 8, in the present embodiment, the first connector portion 25 has a part formed integrally with the second conductor plate 24, and has another part formed integrally with the third conductor plate 26, and these parts are joined to each other by soldering. It should be noted that the structure of the first connector portion 25 is not limited thereto. For example, as shown in FIG. 9, a part or all of the first connector portion 25 may be constituted of a member 25a independent of the second conductor plate 24 and the third conductor plate 26.

Returning to FIGS. 1 to 7, the semiconductor device 10 further comprises a first circuit board 32 and a second circuit board 34. The first circuit board 32 is disposed on the first conductor plate 22 within the encapsulant 20. The first circuit board 32 includes a substrate 32a joined to the first conductor plate 22, and a plurality of signal transmission paths 32b provided on the substrate 32a. The substrate 32a is constituted of an insulator such as, for example, glass or ceramic, and electrically isolates the plurality of signal transmission paths 32b from the first conductor plate 22. On the first conductor plate 22, the first circuit board 32 is located in the first direction X with respect to the first semiconductor element 12, and additionally, the first circuit board 32 and the second semiconductor element 14 are arranged along the second direction Y.

The second circuit board 34 is disposed on the third conductor plate 26 within the encapsulant 20. The second circuit board 34 includes a substrate 34a joined to the third conductor plate 26, and a plurality of signal transmission paths 34b provided on the substrate 34a. The substrate 34a is constituted of an insulator such as, for example, glass or ceramic, and electrically isolates the plurality of signal transmission paths 34b from the third conductor plate 26. On the third conductor plate 26, the second circuit board 34 is located in the first direction X with respect to the third semiconductor element 16, and additionally, the second circuit board 34 and the fourth semiconductor element 18 are arranged along the second direction Y. The second circuit board 34 has the same structure and size as the structure and size of the first circuit board 32, but is not particularly limited thereto.

The semiconductor device 10 further comprises a first power terminal 36 (a P terminal), a second power terminal 38 (an O terminal), and a third power terminal 40 (an N terminal). The power terminals 36, 38, and 40 are each constituted of a conductor such as copper or another metal. The power terminals 36, 38, and 40 each extend both inward and outward of the encapsulant 20. As an example, the three power terminals 36, 38, and 40 are parallel to one another, and project from the encapsulant 20 in the same direction (a direction opposite to the first direction X). The first power terminal 36 is connected to the first conductor plate 22 within the encapsulant 20, and specifically, is formed integrally with the first conductor plate 22. The second power terminal 38 is connected to the third conductor plate 26 within the encapsulant 20, and specifically, is formed integrally with the third conductor plate 26. The third power terminal 40 is connected to the fourth conductor plate 28 within the encapsulant 20, and specifically, is soldered to the fourth conductor plate 28 at a second connector portion 29.

The semiconductor device 10 further comprises a plurality of first signal terminals 42 and a plurality of second signal terminals 44. The signal terminals 42 and 44 are each constituted of a conductor such as copper or another metal. The signal terminals 42 and 44 each extend both inward and outward of the encapsulant 20. The plurality of first signal terminals 42 is located in the first direction X with respect to the first semiconductor element 12. The plurality of first signal terminals 42 projects from the encapsulant 20 in the first direction X, and is arranged along the second direction Y. Some of the plurality of first signal terminals 42 are connected to the plurality of signal pads 12d of the first semiconductor element 12 via the signal transmission paths 32b of the first circuit board 32. A signal is thereby transmitted between the first signal terminals 42 and the first semiconductor element 12 via the first circuit board 32. On the other hand, some of the plurality of first signal terminals 42 are connected to the plurality of signal pads 14d of the second semiconductor element 14, without passing the first circuit board 32. Notably, the plurality of first signal terminals 42 includes a first gate signal terminal 42g. The first gate signal terminal 42g is connected to both of one of the signal pads 12d of the first semiconductor element 12 and one of the signal pads 14d of the second semiconductor element 14. A gate-drive signal inputted to the first gate signal terminal 42g is thereby supplied to both of the first semiconductor element 12 and the second semiconductor element 14.

The plurality of second signal terminals 44 is located in the first direction X with respect to the third semiconductor element 16. The plurality of second signal terminals 44 projects from the encapsulant 20 in the first direction X, and is arranged along the second direction Y. Some of the plurality of second signal terminals 44 are connected to the plurality of signal pads 16d of the third semiconductor element 16 via the signal transmission paths 34b of the second circuit board 34. A signal is thereby transmitted between the second signal terminals 44 and the third semiconductor element 16 via the second circuit board 34. On the other hand, some of the plurality of second signal terminals 44 are connected to the plurality of signal pads 18d of the fourth semiconductor element 18, without passing the second circuit board 34. Notably, the plurality of second signal terminals 44 also includes a second gate signal terminal 44g. The second gate signal terminal 44g is connected to both of one of the signal pads 16d of the third semiconductor element 16 and one of the signal pads 18d of the fourth semiconductor element 18. A gate-drive signal inputted to the second gate signal terminal 44g is thereby supplied to both of the third semiconductor element 16 and the fourth semiconductor element 18.

As an example, the first signal terminals 42 and the first circuit board 32 are connected by first bonding wires 46, and the first signal terminals 42 and the second semiconductor element 14 are connected by second bonding wires 48. The first circuit board 32 and the first semiconductor element 12 are connected by third bonding wires 50. Here, the first bonding wires 46 extend so as to be away from the second bonding wires 48 as the first bonding wires 46 approach the first circuit board 32. Such a structure can suppress mutual interference caused by a noise, for example, between the first bonding wires 46 and the second bonding wires 48, while allowing the plurality of first signal terminals 42 to be disposed at small intervals.

Similarly, the second signal terminals 44 and the second circuit board 34 are connected by fourth bonding wires 52, and the second signal terminals 44 and the fourth semiconductor element 18 are connected by fifth bonding wires 54. The second circuit board 34 and the third semiconductor element 16 are connected by sixth bonding wires 56. Here, the fourth bonding wires 52 extend so as to be away from the fifth bonding wires 54 as the fourth bonding wires 52 approach the second circuit board 34. Such a structure can suppress mutual interference caused by a noise, for example, between the fourth bonding wires 52 and the fifth bonding wires 54, while allowing the plurality of second signal terminals 44 to be disposed at small intervals.

With the above configuration, the semiconductor device 10 in the present embodiment is structured as follows: the parallel circuit made of the first semiconductor element 12 and the second semiconductor element 14 is configured between the first power terminal 36 (the P terminal) and the second power terminal 38 (the O terminal); the parallel circuit made of the third semiconductor element 16 and the fourth semiconductor element 18 is configured between the second power terminal 38 (the O terminal) and the third power terminal 40 (the N terminal); and the semiconductor elements 12, 14, 16, and 18 each include a switching element such as an IGBT or a MOSFET. With such a circuit structure, the semiconductor device 10 in the present embodiment can configure a pair of upper and lower arms in a power conversion circuit such as a converter or an inverter.

In the semiconductor device 10 in the present embodiment, in a plan view along a direction perpendicular to the first conductor plate 22 (see FIG. 2), the plurality of first signal terminals 42 is located in the first direction X with respect to the first semiconductor element 12. In the plan view, the second semiconductor element 14 and the first circuit board 32 are located between the plurality of first signal terminals 42 and the first semiconductor element 12, and are arranged along the second direction Y perpendicular to the first direction X. In other words, the two semiconductor elements 12 and 14 are arranged not along the direction in which the first signal terminals 42 are arranged (i.e., the second direction Y), but along the first direction X perpendicular to this arrangement direction. This can decrease the size of the semiconductor device 10 with respect to the direction in which the first signal terminals 42 are arranged.

On the other hand, such an arrangement causes the first semiconductor element 12 to be disposed apart from the first signal terminals 42. Therefore, it is difficult to connect directly the signal pads 12*d* of the first semiconductor element 12 to the first signal terminals 42. To solve this difficulty, the first circuit board 32 is placed between the first semiconductor element 12 and the first signal terminals 42, and the signal pads 12*d* of the first semiconductor element 12 are connected to the first signal terminals 42 via the first circuit board 32. Here, the second semiconductor element 14 is smaller than the first semiconductor element 12, and the first circuit board 32, which has a simple structure, can also be configured to be relatively small. Accordingly, the second semiconductor element 14 and the first circuit board 32 can be disposed compactly between the first semiconductor element 12 and the plurality of first signal terminals 42.

Similarly, in the plan view along the direction perpendicular to the third conductor plate 26 (see FIG. 2), the plurality of second signal terminals 44 is located in the first direction X with respect to the third semiconductor element 16. In the plan view, the fourth semiconductor element 18 and the second circuit board 34 are located between the plurality of second signal terminals 44 and the third semiconductor element 16, and are arranged along the second direction Y perpendicular to the first direction X. This can decrease the size of the semiconductor device 10 also with respect to the direction in which the second signal terminals 44 are arranged. As such, the structure disclosed herein can be provided in repetitious fashion along the second direction Y, so that the semiconductor device 10 that includes much more semiconductor elements can also be embodied.

In the semiconductor device 10 in the present embodiment, a layout of the first semiconductor element 12, the second semiconductor element 14, and the first circuit board 32 on the first conductor plate 22 is bisymmetric with a layout of the third semiconductor element 16, the fourth semiconductor element 18, and the second circuit board 34 on the third conductor plate 26. Such a configuration increases structural symmetry of the semiconductor device 10, so that durability of the semiconductor device 10, for example, is improved. The semiconductor device 10, in particular, is thermally deformed by heat generated during its use. At this occasion, allowing the semiconductor device 10 to have a highly-symmetric structure suppresses distorted deformation as well as internally-generated thermal stress.

Figure 10:
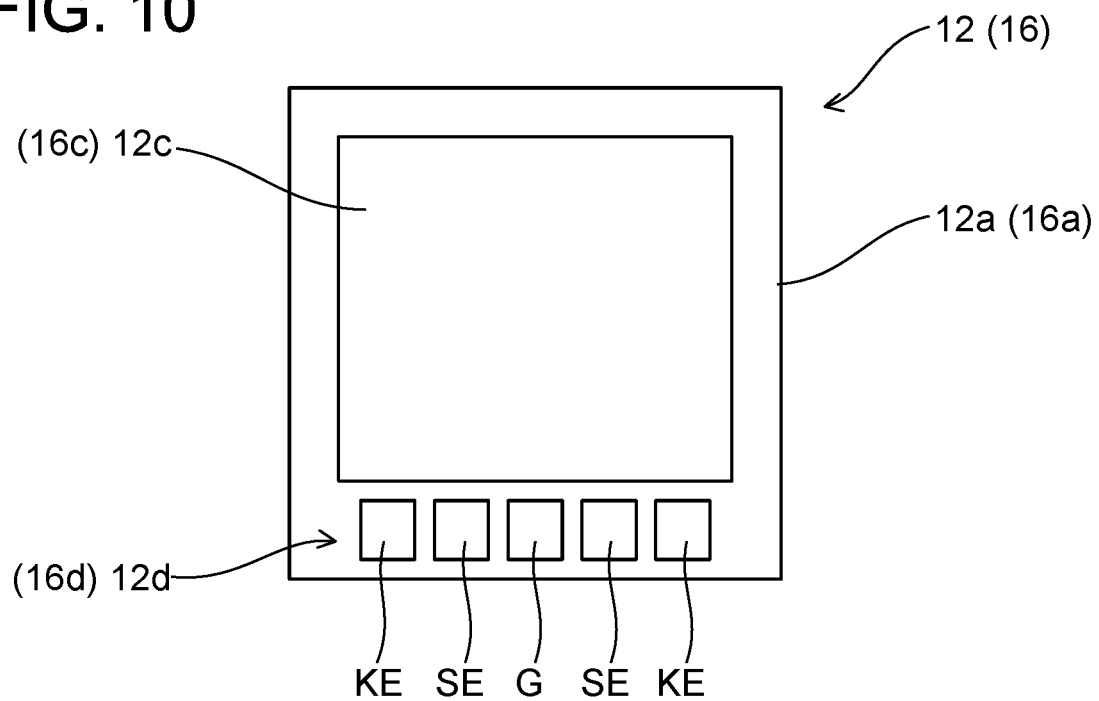
FIG. 10 is a diagram showing an arrangement of a plurality of signal pads 12d (16d) of a first semiconductor element 12 (and a third semiconductor element 16)

In the semiconductor device 10 in the present embodiment, first-kind semiconductor elements having the same configuration are adopted for the first semiconductor element 12 and the third semiconductor element 16. These first-kind semiconductor elements (i.e., the first semiconductor element 12 and the third semiconductor element 16) each comprise the signal pads 12*d* and 16*d* having a same function and arranged to be bisymmetric with each other. As an example, as shown in FIG. 10, the first semiconductor element 12 and the third semiconductor element 16 respectively have five signal pads 12*d*, 16*d* arranged along the second direction Y. A leftmost signal pad (KE) and a rightmost signal pad (KE) have the same function, and specifically, each outputs a signal indicative of an emitter voltage of the IGBT.

Moreover, a second signal pad (SE) from the left and a second signal pad (SE) from the right also have the same function, and specifically, each outputs a signal indicative of a current that flows in the IGBT. Notably, a signal pad (G) located at a center is a gate signal pad, and is connected to a gate of the IGBT. Such a configuration enables a connecting structure between the first semiconductor element 12 and the first circuit board 32 and a connecting structure between the third semiconductor element 16 and the second circuit board 34 to be bisymmetric, while adopting the same semiconductor elements for the first semiconductor element 12 and the third semiconductor element 16.

The above-described configuration can also be adopted for the second semiconductor element 14 and the fourth semiconductor element 18. In other words, the second semiconductor element 14 and the fourth semiconductor element 18 may also be second-kind semiconductor elements having the same configuration. In this case, these second-kind semiconductor elements (i.e., the second semiconductor element 14 and the fourth semiconductor element 18) may respectively include the plurality of signal pads 14*d*, 18*d* arranged along the second direction Y, and in each plurality of signal pads 14*d*, 18*d*, the signal pads having the same function may be arranged bisymmetrically. Such a configuration enables a connecting structure between the second semiconductor element 14 and the first signal terminals 42 and a connecting structure between the fourth semiconductor element 18 and the second signal terminals 44 to be bisymmetric, while adopting the semiconductor elements of the same kind for the second semiconductor element 14 and the fourth semiconductor element 18.

In the semiconductor device 10 in the present embodiment, a bandgap of the semiconductor substrate 14*a* of the second semiconductor element 14 is wider than a bandgap of the semiconductor substrate 12*a* of the first semiconductor element 12. The so-called wide-bandgap semiconductor substrate 14*a* is superior in performance, but has a drawback of being relatively expensive. In view of this, adopting the wide-bandgap semiconductor substrate 14*a* for the second semiconductor element 14, which has a smaller device size, can improve performance of the semiconductor device 10, while reducing a cost of manufacturing the semiconductor device 10. As mentioned above, the semiconductor substrate 12*a* of the first semiconductor element 12 is a silicon substrate, and the semiconductor substrate 14*a* of the second semiconductor element 14 is a silicon carbide substrate. It should be noted that this combination is an example, and combinations of various semiconductor substrates can be adopted for the first semiconductor element 12 and the second semiconductor element 14.

Figure 11:
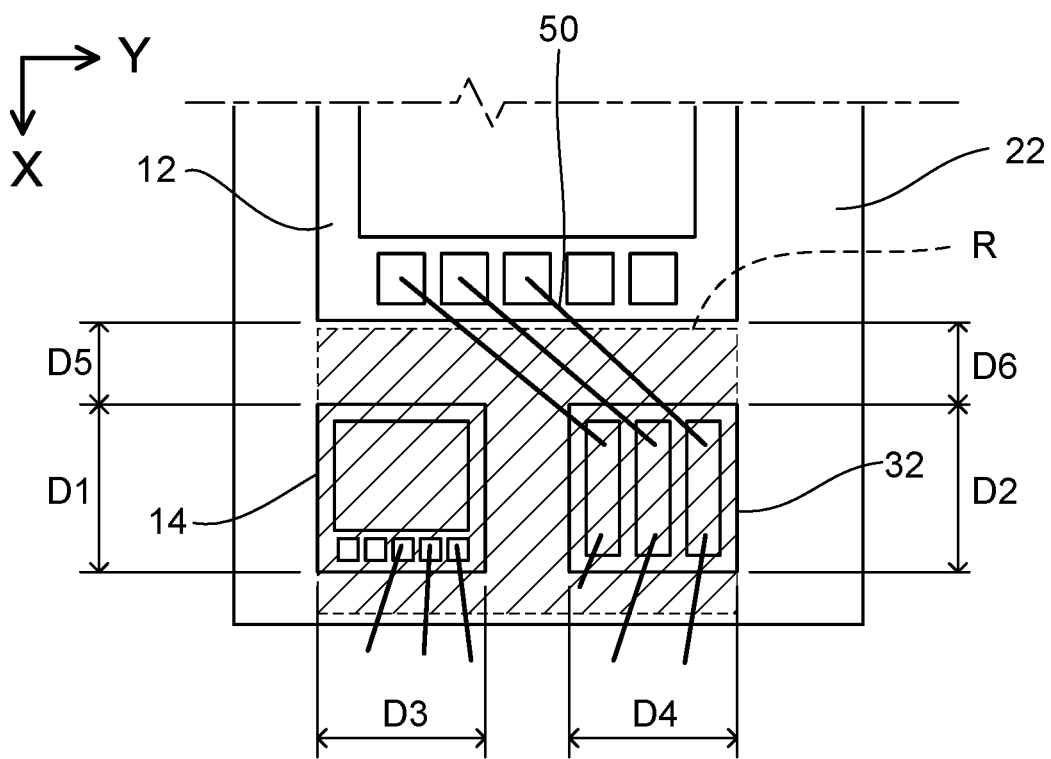
FIG. 11 is a diagram showing a positional relation between the first semiconductor element, a second semiconductor element 14, and a first circuit board 32 on the first conductor plate 22.

As shown in FIG. 11, in the semiconductor device 10 in the present embodiment, a dimension D1 of the second semiconductor element 14 in the first direction X may be equal to a dimension D2 of the first circuit board 32 in the first direction X. Additionally or alternatively, a dimension D3 of the second semiconductor element 14 in the second direction Y may be equal to a dimension D4 of the first circuit board 32 in the second direction Y. These configurations increase structural symmetry between the second semiconductor element 14 and the first circuit board 32, so that durability of the semiconductor device 10, for example, can be improved. Moreover, an interval D5 between the first semiconductor element 12 and the second semiconductor element 14 in the first direction X may be equal to an interval D6 between the first semiconductor element 12 and the first circuit board 32 in the first direction X. Such a configuration also increases structural symmetry between the second semiconductor element 14 and the first circuit board 32, so that durability of the semiconductor device 10, for example, can be improved.

The above-described configuration can also be adopted for the fourth semiconductor element 18 and the second circuit board 34. In other words, a dimension of the fourth semiconductor element 18 in the first direction X may be equal to a dimension of the second circuit board 34 in the first direction. Additionally or alternatively to this, a dimension of the fourth semiconductor element 18 in the second direction Y may be equal to a dimension of the second circuit board 34 in the second direction. Such a configuration increases structural symmetry between the fourth semiconductor element 18 and the second circuit board 34, so that durability of the semiconductor device 10, for example, can be improved. Moreover, an interval between the third semiconductor element 16 and the fourth semiconductor element 18 in the first direction X may be equal to an interval between the third semiconductor element 16 and the second circuit board 34 in the first direction X.

As shown in FIG. 11, in the semiconductor device 10 in the present embodiment, the second semiconductor element 14 and the first circuit board 32 may be located within a region R defined by virtually expanding the first semiconductor element 12 in the first direction X. Notably, FIG. 11 shows the region R in a hatched manner. Such a structure can sufficiently decrease the size of the semiconductor device 10 with respect to the direction in which the first signal terminals 42 are arranged (i.e., the second direction Y). It should be noted that, as another embodiment, a part of the second semiconductor element 14 and/or a part of the first circuit board 32 may be located outside the region R. Although not shown, the fourth semiconductor element 18 and the second circuit board 34 may also be located within a region defined by virtually expanding the third semiconductor element 16 in the first direction X.

Figure 12:
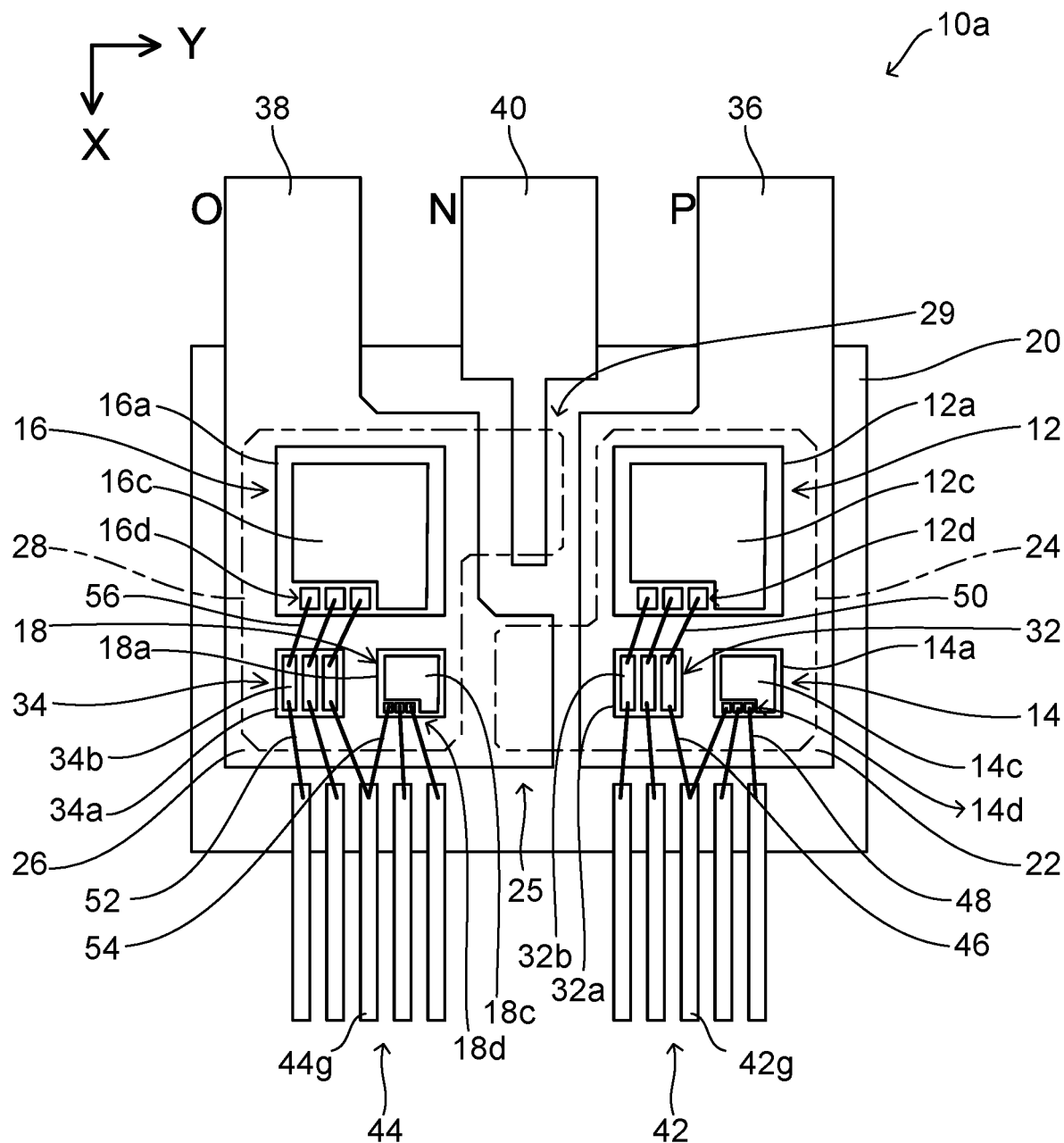
FIG. 12 shows an internal structure of a semiconductor device 10a in a variation in the plan view along the direction perpendicular to the conductor plates 22, 24, 26, and 28.

As shown in FIG. 12, in a semiconductor device 10*a* in another embodiment, a layout of the first semiconductor element 12, the second semiconductor element 14, and the first circuit board 32 on the first conductor plate 22 may be identical with a layout of the third semiconductor element 16, the fourth semiconductor element 18, and the second circuit board 34 on the third conductor plate 26. Such a structure can facilitate, for example, designing and manufacturing of the semiconductor device 10*a*, although that depends on other conditions also. Here, in the semiconductor elements 12, 14, 16, and 18, the plurality of signal pads 12*d*, 14*d*, 16*d*, and 18*d* do not necessarily need to be provided bisymmetrically, respectively. Therefore, the number of the signal pads 12*d*, 14*d*, 16*d*, and 18*d* can be reduced respectively in each of the semiconductor elements 12, 14, 16, and 18. This can increase areas of the upper electrodes 12*c*, 14*c*, 16*c*, and 18*c*, or increase regions in the semiconductor substrates 12*a*, 14*a*, 16*a*, and 18*a* where a current flows.

What is claimed is:

1. A semiconductor device comprising:
  a first conductor plate;
  a first semiconductor element disposed on the first conductor plate;
  a second semiconductor element disposed on the first conductor plate, a size of the second semiconductor element being smaller than a size of the first semiconductor element;
  a first circuit board disposed on the first conductor plate and including a signal transmission path which is electrically isolated from the first conductor plate; and
  a plurality of first signal terminals,
  wherein the first semiconductor element and the second semiconductor element each comprise a main electrode electrically connected to the first conductor plate and a signal pad electrically connected to a corresponding one of the plurality of first signal terminals,
  in a plan view, the plurality of first signal terminals is spaced from the first semiconductor element in a first direction and is arranged along a second direction that is perpendicular to the first direction,
  in the plan view, the second semiconductor element and the first circuit board are located between the plurality of first signal terminals and the first semiconductor element and are arranged along the second direction, and
  the signal pad of the first semiconductor element is connected to the corresponding one of the plurality of first signal terminals via the signal transmission path of the first circuit board.

2. The semiconductor device according to claim 1, further comprising a second conductor plate opposed to the first conductor plate, wherein the first semiconductor element and the second semiconductor element each comprise another main electrode which is electrically connected to the second conductor plate.

3. The semiconductor device according to claim 2, further comprising:
  a third conductor plate located in the second direction with respect to the first conductor plate,
  a third semiconductor element disposed on the third conductor plate;
  a fourth semiconductor element disposed on the third conductor plate, a size of the fourth semiconductor element being smaller than a size of the third semiconductor element;
  a second circuit board disposed on the third conductor plate and including a signal transmission path which is electrically isolated from the third conductor plate; and a plurality of second signal terminals,
wherein the third semiconductor element and the fourth semiconductor element each comprise a main electrode electrically connected to the third conductor plate and a signal pad electrically connected to a corresponding one of the plurality of second signal terminals,
in the plan view, the plurality of second signal terminals is spaced from the third semiconductor element in the first direction and is arranged along the second direction,
in the plan view, the fourth semiconductor element and the second circuit board are located between the plurality of second signal terminals and the third semiconductor element and are arranged along the second direction, and
the signal pad of the third semiconductor element is connected to the corresponding one of the plurality of second signal terminals via the signal transmission path of the second circuit board.

4. The semiconductor device according to claim 3, further comprising a fourth conductor plate opposed to the third conductor plate, wherein the third semiconductor element and the fourth semiconductor element each comprise another main electrode which is electrically connected to the fourth conductor plate.

5. The semiconductor device according to claim 3, wherein
the third conductor plate is connected to the second conductor plate via a first connector portion, and
in the plan view, the first connector portion is located between the second semiconductor element and the fourth semiconductor element.

6. The semiconductor device according to claim 3, wherein a layout of the first semiconductor element, the second semiconductor element and the first circuit board on the first conductor plate is bisymmetric with a layout of the third semiconductor element, the fourth semiconductor element and the second circuit board on the third conductor plate.

7. The semiconductor device according to claim 6, wherein
the first semiconductor element and the third semiconductor element are first-kind semiconductor elements including a same configuration as each other,
the first-kind semiconductor elements each comprise a plurality of signal pads that is arranged along the second direction,
the plurality of signal pads comprises a pair of the signal pads having a same function, and
the pair of the signal pads is located bisymmetrically in an arrangement of the plurality of signal pads.

8. The semiconductor device according to claim 3, wherein a layout of the first semiconductor element, the second semiconductor element and the first circuit board on the first conductor plate is identical with a layout of the third semiconductor element, the fourth semiconductor element and the second circuit board on the third conductor plate.

9. The semiconductor device according to claim 1, wherein a bandgap of a semiconductor substrate of the second semiconductor element is wider than a bandgap of a semiconductor substrate of the first semiconductor element.

10. The semiconductor device according to claim 9, wherein
the semiconductor substrate of the first semiconductor element is a silicon substrate, and
the semiconductor substrate of the second semiconductor element is a silicon carbide substrate.

11. The semiconductor device according to claim 1, further comprising:
a first bonding wire connecting between one of the plurality of first signal terminals and the signal transmission path of the first circuit board; and
a second bonding wire connecting between another one of the plurality of first signal terminals and the signal pad of the second semiconductor element,
wherein the first bonding wire extends so as to be away from the second bonding wire as the first bonding wire approaches the first circuit board.

12. The semiconductor device according to claim 1, wherein a dimension of the second semiconductor element in the first direction is equal to a dimension of the first circuit board in the first direction.

13. The semiconductor device according to claim 1, wherein a dimension of the second semiconductor element in the second direction is equal to a dimension of the first circuit board in the second direction.

14. The semiconductor device according to claim 1, wherein an interval between the first semiconductor element and the second semiconductor element in the first direction is equal to an interval between the first semiconductor element and the first circuit board in the first direction.

15. The semiconductor device according to claim 1, wherein the second semiconductor element and the first circuit board are located within a region defined by virtually expanding the first semiconductor element in the first direction.

* * * * *